(12) United States Patent
Huang et al.

(10) Patent No.: US 12,051,659 B2
(45) Date of Patent: Jul. 30, 2024

(54) SEMICONDUCTOR DEVICES HAVING CONDUCTIVE PAD STRUCTURES WITH MULTI-BARRIER FILMS

(71) Applicant: Taiwan Semiconductor Manufacturing Company, Ltd., Hsinchu (TW)

(72) Inventors: Po-Hsun Huang, Tainan (TW); Po-Han Wang, Kaohsiung (TW); Ing-Ju Lee, Tainan (TW); Chao-Lung Chen, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/314,923

(22) Filed: May 10, 2023

(65) Prior Publication Data
US 2023/0275049 A1 Aug. 31, 2023

Related U.S. Application Data

(60) Division of application No. 17/719,895, filed on Apr. 13, 2022, now Pat. No. 11,688,703, which is a (Continued)

(51) Int. Cl.
*H01L 23/00* (2006.01)
*H01L 21/768* (2006.01)
(Continued)

(52) U.S. Cl.
CPC ........ *H01L 24/03* (2013.01); *H01L 21/76855* (2013.01); *H01L 21/76865* (2013.01);
(Continued)

(58) Field of Classification Search
CPC ......... H01L 21/76841; H01L 21/76843; H01L 21/76849; H01L 21/7685; H01L 21/76853;
(Continued)

(56) References Cited

U.S. PATENT DOCUMENTS

| 11,309,265 | B2 | 4/2022 | Huang et al. |
| 2008/0274610 | A1* | 11/2008 | Choi ........................ H01L 24/03 438/653 |

(Continued)

*Primary Examiner* — David C Spalla
(74) *Attorney, Agent, or Firm* — Birch, Stewart, Kolasch & Birch, LLP

(57) ABSTRACT

Semiconductor devices are provided. The semiconductor device includes a substrate, an interconnect structure, and a conductive pad structure. The interconnect structure is over the substrate and includes a top metal layer. The conductive pad structure is over the interconnect structure and includes a lower barrier film, an upper barrier film, and an aluminum-containing layer. The lower barrier film is on the top metal layer. The upper barrier film is on the lower barrier film and has an amorphous structure. The aluminum-containing layer is on the upper barrier film. The lower barrier film and the upper barrier film are made of a same material, and a nitrogen atomic percentage of the upper barrier film is higher than a nitrogen atomic percentage of the lower barrier film.

20 Claims, 10 Drawing Sheets

Related U.S. Application Data continuation of application No. 16/503,773, filed on Jul. 5, 2019, now Pat. No. 11,309,265.

(60) Provisional application No. 62/711,903, filed on Jul. 30, 2018.

(51) Int. Cl.
  *H01L 23/528* (2006.01)
  *H01L 23/532* (2006.01)

(52) U.S. Cl.
  CPC .... *H01L 23/5283* (2013.01); *H01L 23/53223* (2013.01); *H01L 23/53238* (2013.01); *H01L 24/08* (2013.01)

(58) Field of Classification Search
  CPC ......... H01L 21/76855; H01L 21/76865; H01L 23/528; H01L 23/5283; H01L 23/53223; H01L 23/53238; H01L 24/03; H01L 24/04; H01L 24/05; H01L 24/07; H01L 24/08; H01L 24/13; H01L 27/14636
  See application file for complete search history.

(56) References Cited

U.S. PATENT DOCUMENTS

| | | | |
|---|---|---|---|
| 2011/0084391 A1* | 4/2011 | Cheng | H01L 24/05 257/E23.157 |
| 2017/0179033 A1* | 6/2017 | West | H01L 23/53223 |
| 2017/0194152 A1* | 7/2017 | Chang | H01L 29/0642 |

* cited by examiner

SEMICONDUCTOR DEVICES HAVING CONDUCTIVE PAD STRUCTURES WITH MULTI-BARRIER FILMS

PRIORITY CLAIM AND CROSS-REFERENCE

This application is a Divisional of U.S. patent application Ser. No. 17/719,895, filed on Apr. 13, 2022, which is a Continuation application of U.S. patent application Ser. No. 16/503,773, filed on Jul. 5, 2019, now U.S. Pat. No. 11,309,265, issued on Apr. 19, 2022, which claims the benefit of U.S. Provisional Application No. 62/711,903, filed on Jul. 30, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements on the semiconductor substrate.

Once the fabrication of a semiconductor device is complete, a bonding pad formed on the fabricated semiconductor device is coupled to an external electronic element using one of various bonding processes. One common bonding process is performed by forming a bonding wire or a solder ball on the bonding pad to connect the external electronic element with the bonding pad. Although existing bonding pads have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
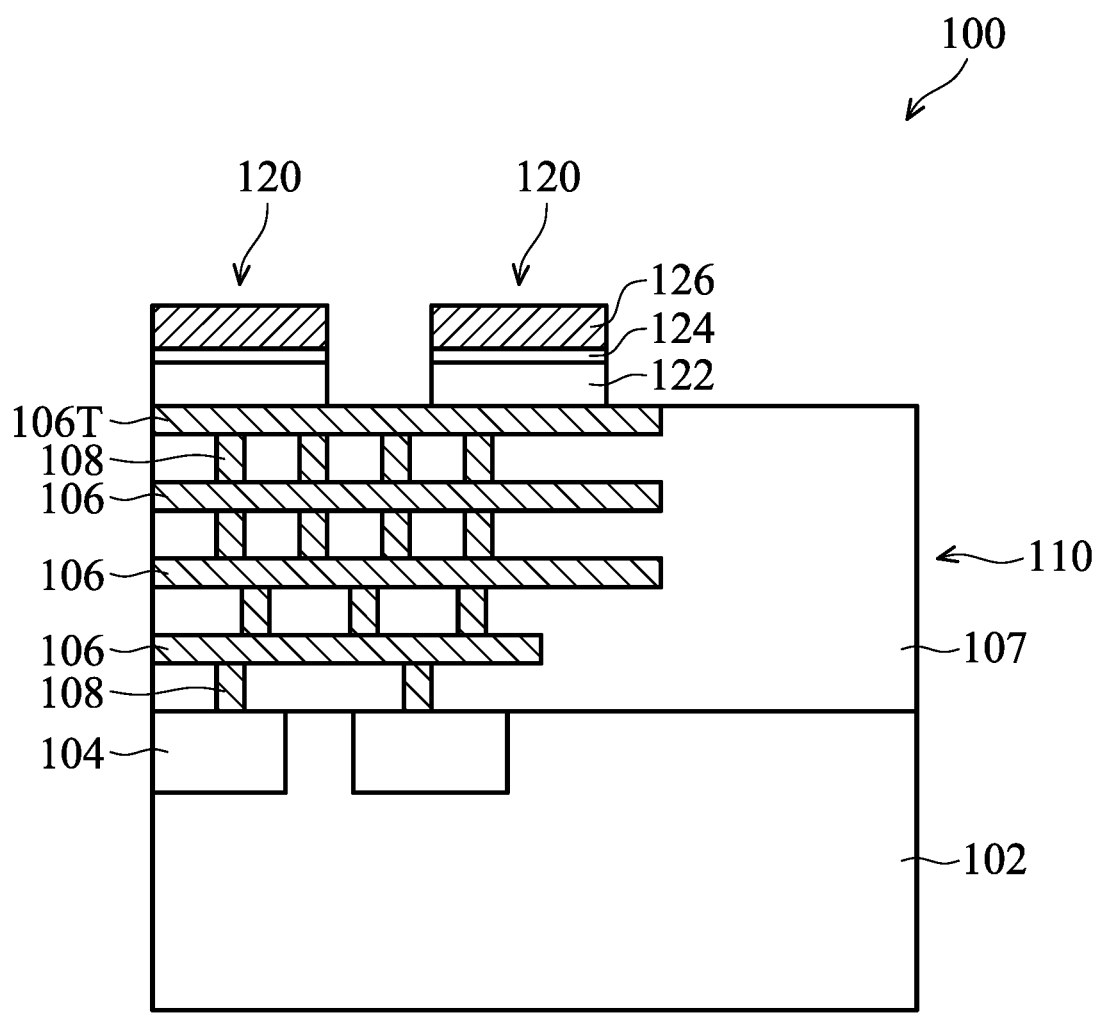
FIG. 1 shows a cross-sectional view of a semiconductor device having a conductive pad structure, in accordance with some embodiments.

The following disclosure provides many different embodiments, or examples, for implementing different features of the provided subject matter. Specific examples of electronic elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described therein can be replaced or eliminated for other embodiments of the method.

Embodiments disclosed herein relate generally to fabricating semiconductor devices having a conductive pad structure with multi-barrier films to prevent metal extrusion. The metal extrusion is from a metal layer under the conductive pad structure and/or from an aluminum-containing layer of the conductive pad structure. In some embodiments, the metal layer under the conductive pad structure is a top metal layer of an interconnect structure. The top metal layer may contain copper (Cu).

According to embodiments of the disclosure, the multi-barrier films of the conductive pad structure can prevent copper (Cu) of the top metal layer from extrusion. In addition, the multi-barrier films of the conductive pad structure can prevent aluminum (Al) of the aluminum-containing layer of the conductive pad structure from extrusion. The metal extrusions will cause adjacent pads of semiconductor devices occurring a short circuit. The embodiments of the disclosure can overcome the metal extrusions, and the production yield and the reliability of the semiconductor devices are thereby enhanced.

In some embodiments, the multi-barrier films of the conductive pad structure include a first barrier film and a second barrier film. The second barrier film is disposed between the first barrier film and the aluminum-containing layer of the conductive pad structure. The first barrier film is formed on a top metal layer of an interconnect structure using a first deposition process with a first level of power. The second barrier film is formed on the first barrier film using a second deposition process with a second level of power. The second level of power used for depositing the second barrier film is lower than the first level of power used for depositing the first barrier film.

According to embodiments of the disclosure, the second barrier film formed using a lower level of power has an amorphous structure to provide a metal barrier ability for the metal of the top metal layer under the second barrier film. Moreover, the second barrier film formed using a lower level of power has a high compressive stress to balance with the tensile stress of the aluminum-containing layer above the second barrier film. Therefore, the multi-barrier films of the conductive pad structure can prevent the metal extrusion of the top metal layer of the interconnect structure and the metal extrusion of the aluminum-containing layer of the conductive pad structure.

The foregoing broadly outlines some aspects of embodiments. Some embodiments described herein are described in the context of a conductive pad structure of semiconductor devices and methods for forming the conductive pad structure. The semiconductor devices may be any type semiconductor devices having contact pads and/or bonding pads for electrical connection. The semiconductor devices are for example, Fin Field Effect Transistor (FinFET) devices, semiconductor image sensor devices, or other semiconductor devices. In addition, the conductive pad structures of the embodiments of the disclosure may be applied to three-dimensional (3D) packages for bonding stacked dies, chips, fabricated wafers, or interposer substrates. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more operations than what is described herein.

Embodiments for forming semiconductor devices having conductive pads are provided. FIG. 1 shows a cross-sectional view of a semiconductor device 100 having a conductive pad structure 120, in accordance with some embodiments. A substrate 102 is provided, as shown in FIG. 1 in accordance with some embodiments. The substrate 102 may be a bulk semiconductor substrate, a semiconductor-on-insulator (SOI) substrate, or other semiconductor substrate, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or other insulating material. The insulator layer is provided on a silicon or glass substrate. The substrate 102 may be made of silicon or other semiconductor material. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

The substrate 102 may comprise multiple electronic elements 104 formed therein or thereon. The electronic elements 104 may be active electronic elements such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, memory cells, and/or a combination thereof. Furthermore, the electronic elements 104 may be passive electronic elements such as resistors, capacitors, and inductors. The substrate 102 may further comprise static random access memory (SRAM) and/or other logic circuits formed therein or thereon.

An interconnect structure 110 is formed over the substrate 102 for electrically coupling various electronic elements 104 to fabricate integrated circuit. In the illustrated embodiment of FIG. 1, there are three metal layers 106 and a top metal layer 106T in the interconnect structure 110, but other numbers of metal layers may be used in other embodiments. For example, the interconnect structure 110 may include five to ten metal layers, but fewer or more metal layers are used in other embodiments. The multiple metal layers of the interconnect structure 110 include the top metal layer 106T and the other metal layers 106. The metal layers 106 and the top metal layer 106T are disposed in multiple inter-metal-dielectric (IMD) layers 107 of the interconnect structure 110. The interconnect structure 110 also includes multiple vias 108 disposed in the IMD layers 107 between the metal layers 106 and the top metal layer 106T for providing a vertical electrical connection between the adjacent metal layers. The metal layers 106 and the top metal layer 106T can provide a horizontal electrical connection for the interconnect structure 110.

In some embodiments, the metal layers 106 and the top metal layer 106T are made of the same material, such as selected from a group consisting of aluminum, aluminum silicon, copper, other metals and various alloys. In some other embodiments, the metal layers 106 and the top metal layer 106T are made of different materials, such as selected from a group consisting of aluminum, aluminum silicon, copper, other metals and various alloys. In one embodiment, the top metal layer 106T and the metal layers 106 are all made of copper. In some embodiments, the vias 108 are made of various suitable conductive materials, such as but not limited to aluminum, aluminum silicon, copper, aluminum copper, other metal or alloy. In some examples, the vias 108 include barrier type materials such as tungsten as a liner of the vias 108.

In some embodiments, the inter-metal-dielectric (IMD) layers 107 are made of various suitable dielectric materials, such as silicon oxide, silicon nitride, silicon oxynitride, high dielectric constant (high-k) dielectric materials, or another suitable dielectric material. In some examples, the multiple IMD layers 107 are made of the same dielectric material. In some other examples, the multiple IMD layers 107 are made of different dielectric materials. In some embodiments, the metal layers 106, the top metal layer 106T, and the vias 108 are formed using a damascene process or a dual damascene process. In the dual damascene process, a via opening and a trench opening are formed in the IMD layers 107 using two etching processes, in which the trench opening is above the via opening. The via opening and the trench opening are filled with a conductive material. Then, the conductive material outside of the trench opening is removed by a planarization process such as a chemical mechanical polishing (CMP) process to form the metal layer 106 or the top metal layer 106T in the trench opening and to form the via 108 in the via opening.

Multiple conductive pad structures 120 are formed on the top metal layer 106T of the interconnect structure 110, as shown in FIG. 1 in accordance with some embodiments. The conductive pad structures 120 are in contact with the top metal layer 106T. If the metal of the top metal layer is extruded from the top metal layer into the space between adjacent pads after the semiconductor device is subjected to a thermal process, there will be a short circuit between the adjacent pads. According to some embodiments of the disclosure, the conductive pad structure 120 includes a first barrier film 122 on the top metal layer 106T, a second barrier film 124 on the first barrier film 122, and an aluminum-containing layer 126 on the second barrier film 124. The configuration of the first barrier film 122 and the second barrier film 124 can avoid the metal extrusion of the top metal layer 106T. Therefore, there is no short circuit occurring between the adjacent conductive pad structures 120. The more details will be described as following.

Figure 2:
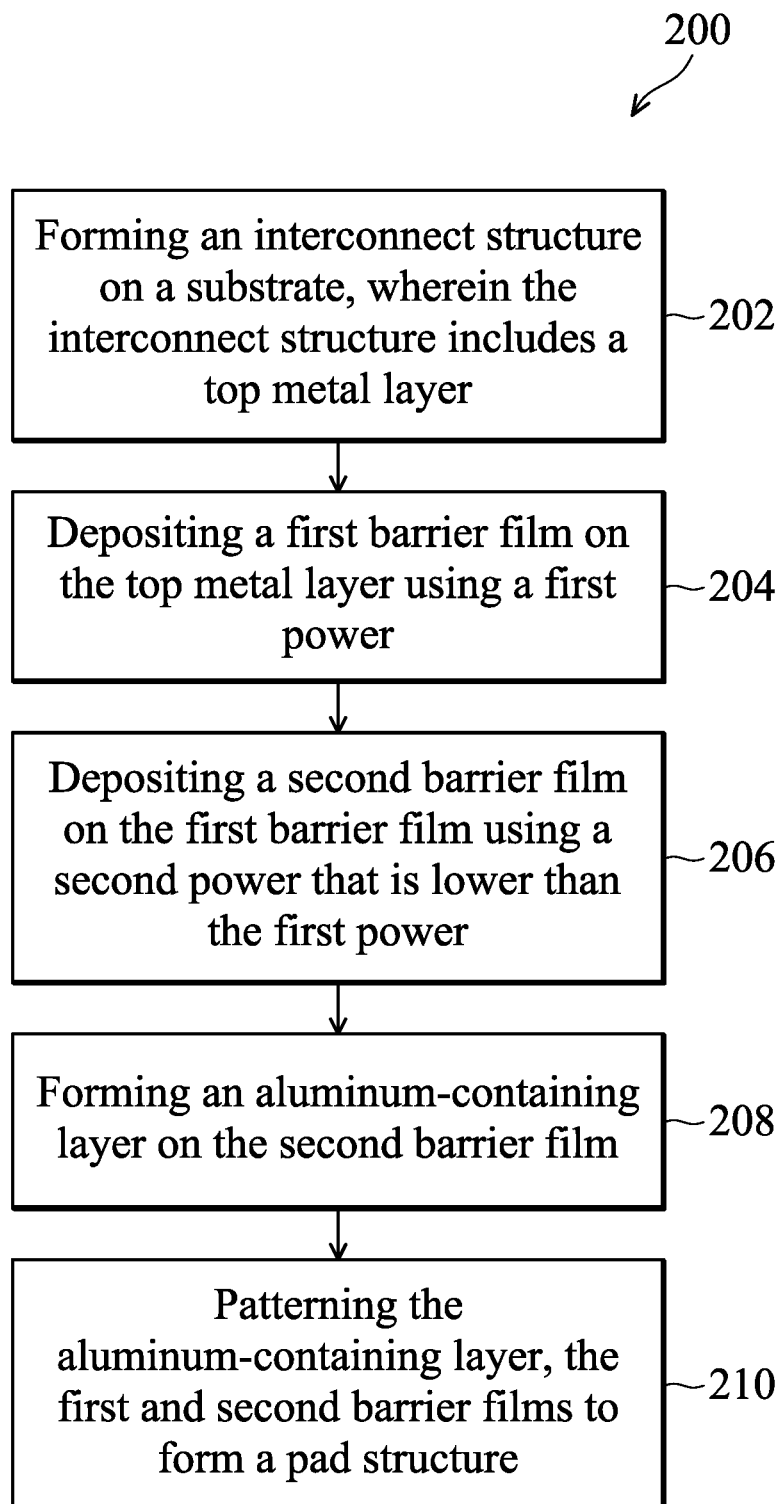
FIG. 2 is a flow chart of an exemplary method of forming a conductive pad structure of a semiconductor device, in accordance with some embodiments.

FIG. 2 is a flow chart of an exemplary method 200 of forming a conductive pad structure of a semiconductor device, for example the conductive pad structure 120 of the semiconductor device 100 of FIG. 1, in accordance with some embodiments. FIGS. 3A-3E show cross-sectional views of respective intermediate structures for forming a conductive pad structure, for example the conductive pad structure 120 of the semiconductor device 100 of FIG. 1, in accordance with some embodiments. The method 200 as shown in FIG. 2 may be described with reference to FIG. 1 and FIGS. 3A-3E.

In operation 202 of the method 200, an interconnect structure is formed on a substrate. The interconnect structure includes a top metal layer. For example, the interconnect structure 110 is formed on the substrate 102, as shown in FIG. 1 in accordance with some embodiments. The interconnect structure 110 includes the top metal layer 106T. The details of the interconnect structure 110 are described in the above-mentioned description and are not repeated again.

Figure 3A:
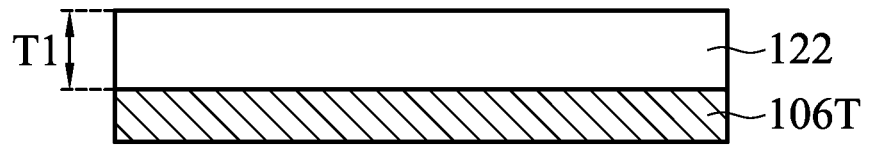
FIGS. 3A-3E show cross-sectional views of respective intermediate structures for forming a conductive pad structure, in accordance with some embodiments.

In operation 204 of the method 200, a first barrier film is deposited on the top metal layer using a first deposition process with a first level of power. For example, the first barrier film 122 is formed on the top metal layer 106T using the first deposition process with the first level of power, as shown in FIG. 3A in accordance with some embodiments. In some embodiments, the first barrier film 122 is made of metal nitride such as a tantalum nitride (TaN) film. The first deposition process includes a physical vapor deposition (PVD) process, sputtering, evaporation, atomic layer deposition (ALD) process or another suitable deposition process. The first level of power used in the first deposition process such as a PVD process is for example to produce Argon (Ar) plasma. In some embodiments, the first level of power is in a range from about 2000 W to about 10000 W, for example about 6000 W. In some other embodiments, the first barrier film 122 may be made of other suitable barrier materials to prevent the metal of the top metal layer 106T from extrusion. In some embodiments, the first barrier film 122 has a thickness T1 in a range from about 400 Å to about 800 Å, for example from about 484 Å to about 684 Å.

Figure 3B:
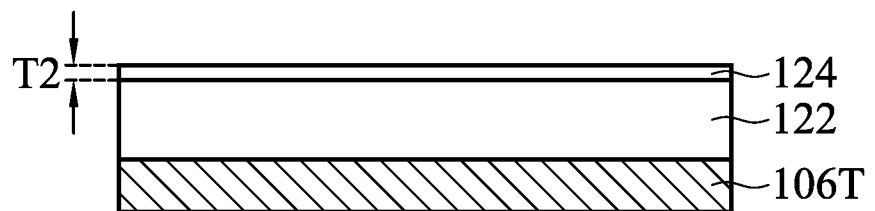

In operation 206 of the method 200, a second barrier film is deposited on the first barrier film using a second deposition process with a second level of power that is lower than the first level of power. For example, the second barrier film 124 is formed on the first barrier film 122 using the second deposition process with the second level of power, as shown in FIG. 3B in accordance with some embodiments. In some embodiments, the second barrier film 124 is made of the same material as the first barrier film 122. For example, the second barrier film 124 may also be a tantalum nitride (TaN) film. The second deposition process includes a physical vapor deposition (PVD) process, sputtering, evaporation, atomic layer deposition (ALD) process or another suitable deposition process. The second level of power used in the second deposition process such as a PVD process is for example to produce Ar plasma. In some embodiments, the second level of power in a range from about 100 W to lower than about 2000 W, for example about 500 W. In some other embodiments, the second barrier film 124 may be made of other suitable barrier materials to prevent the metal of the top metal layer 106T from extrusion. In some embodiments, the second barrier film 124 has a thickness T2 in a range from about 5 Å to about 200 Å, for example from about 10 Å to about 180 Å. In some embodiments, the thickness T1 of the first barrier film 122 is in a range from about 2.5 times to about 70 times greater than the thickness T2 of the second barrier film 124.

Figure 3C:
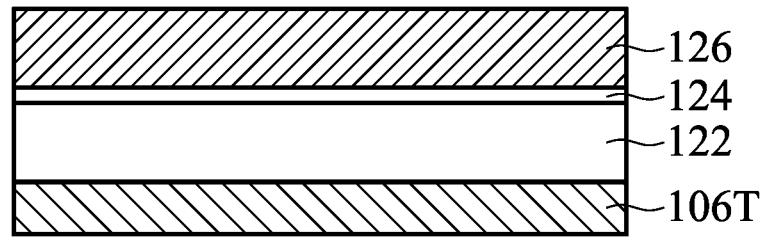

In operation 208 of the method 200, an aluminum-containing layer is formed on the second barrier film. For example, the aluminum-containing layer 126 is formed on the second barrier film 124, as shown in FIG. 3C in accordance with some embodiments. In some embodiments, the aluminum-containing layer 126 may be an aluminum copper alloy (AlCu) layer, an aluminum (Al) layer or made of other conductive material containing aluminum and providing a satisfactory conductivity. The aluminum-containing layer 126 may be formed using a physical vapor deposition (PVD) process, sputtering, evaporation, atomic layer deposition (ALD) process or another suitable deposition process. In some examples, the aluminum-containing layer 126 has a thickness in a range from about 500 Å to about 1000 Å.

Figure 3D:
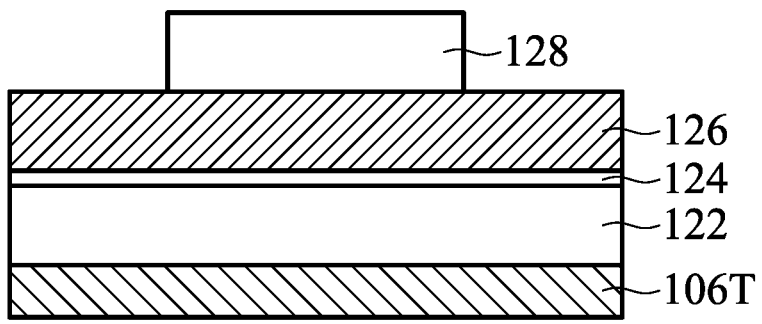
Figure 3E:
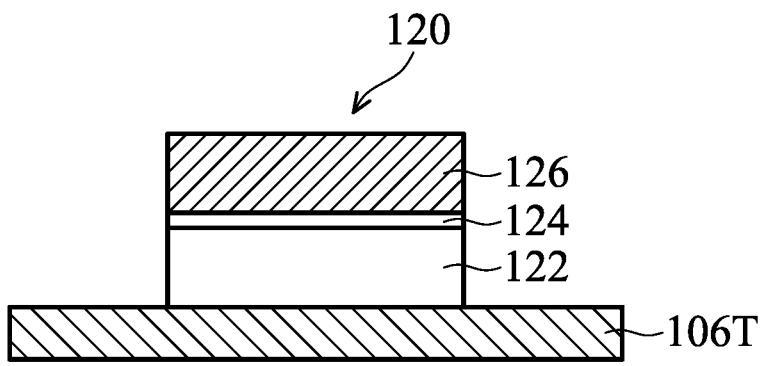

In operation 210 of the method 200, the aluminum-containing layer, the first barrier film and the second barrier film are patterned to form a conductive pad structure. For example, the aluminum-containing layer 126, the first barrier film 122 and the second barrier film 124 are patterned to form the conductive pad structure 120, as shown in FIGS. 3D and 3E in accordance with some embodiments. In some embodiments, an etching mask 128 is formed on the aluminum-containing layer 126 as shown in FIG. 3D. The etching mask 128 may be a patterned photoresist layer or a hard mask. The patterned photoresist layer can be formed using a photolithography technology. The photolithography technology includes forming a photoresist layer overlying the aluminum-containing layer 126, exposing the photoresist layer to a pattern through a photo-mask, performing a post-exposure bake process, and developing the photoresist layer to pattern the photoresist layer to form the patterned photoresist layer as the etching mask 128.

In some other examples, the etching mask 128 is a hard mask that can be formed using photolithography and etching processes. First, a mask layer (not shown) is formed on the aluminum-containing layer 126. Next, a photoresist layer (not shown) is formed overlying the mask layer. The photoresist layer is patterned using a photolithography technology that includes exposing the photoresist layer to a pattern through a photo-mask, performing a post-exposure bake process, and developing the photoresist layer to pattern the photoresist layer. Thereafter, the pattern of the photoresist layer is transferred to the mask layer using a suitable etching process to form the hard mask as the etching mask 128.

The aluminum-containing layer 126, the first barrier film 122 and the second barrier film 124 are patterned using a suitable etching process with the etching mask 128 to protect the portions of the aluminum-containing layer 126, the first barrier film 122 and the second barrier film 124 under the etching mask 128. The etching process may be one or more etching steps which are selected to the materials of the aluminum-containing layer 126, the first barrier film 122 and the second barrier film 124. As a result, the conductive pad structure 120 is formed on the top metal layer 106T, as shown in FIG. 3E in accordance with some embodiments.

In some embodiments of the disclosure, both the first barrier film 122 and the second barrier film 124 are tantalum nitride (TaN) films. The second barrier film 124 is deposited using a lower level of power than that for depositing the first barrier film 122. Therefore, the second barrier film 124 has a higher nitrogen (N) atomic percentage than that of the first barrier film 122. In some embodiments, the N atomic percentage of the second barrier film 124 is in a range from about 2.5 times to about 5 times greater than the N atomic percentage of the first barrier film 122. In some embodiments, the second barrier film 124 has an atomic ratio of N to TaN in a range from about 0.86 to about 0.93. The first barrier film 122 has an atomic ratio of N to TaN in a range from about 0.19 to about 0.31. In some embodiments, the N to TaN atomic ratio of the second barrier film 124 to the N to TaN atomic ratio of the first barrier film 122 is in a range from about 2.5 to about 5.0, for example about 2.77 to about 4.90.

A tantalum nitride (TaN) film with a higher N to TaN atomic ratio has an amorphous structure while another TaN film with a lower N to TaN atomic ratio has a crystalline structure. The TaN film with an amorphous structure has a metal (for example Cu) barrier ability better than that of the TaN film with a crystalline structure. Therefore, the second barrier film 124 having a higher N to TaN atomic ratio can provide a better metal barrier ability than that of the first barrier film 122 having a lower N to TaN atomic ratio. According to the embodiments of the disclosure, the second barrier film 124 deposited using a low level of power can provide a better metal barrier ability to prevent the metal such as Cu of the top metal layer 106T from extrusion. As the N to TaN atomic ratio of the second barrier film 124 is higher, the amount of metal (such as Cu) extrusion of the top metal layer 106T is lower.

In addition, the aluminum-containing layer 126 such as AlCu layer has a tensile stress. The tensile stress of the aluminum-containing layer 126 cause Al extrusion that will damage the conductive pad structure 120. A tantalum nitride (TaN) film with a higher N to TaN atomic ratio has a higher compressive stress than another TaN film with a lower N to TaN atomic ratio. Therefore, the second barrier film 124 with a higher N to TaN atomic ratio has a higher compressive stress than that of the first barrier film 122 to balance the tensile stress of the aluminum-containing layer 126. As the tensile stress of the aluminum-containing layer 126 is lower, the amount of Al extrusion of the aluminum-containing layer 126 is lower.

According to the embodiments of the disclosure, the second barrier film 124 deposited using a low level of power can provide a high compressive stress to balance the tensile stress of the aluminum-containing layer 126 and thereby prevent Al extrusion of the aluminum-containing layer 126. As a result, conductive pad structures 120 of good quality are obtained to improve the yield of semiconductor devices.

In some examples, the second barrier film 124 is replaced with a Ta film. The Ta film has a crystalline structure, and thereby has low metal barrier ability. The metal (such as Cu) of the top metal layer 106T can easily pass through the crystalline structure of the Ta film and cause Cu extrusion defect around the conductive pad structure. According to the embodiments of the disclosure, the second barrier film 124 such as TaN film deposited using a low level of power has an amorphous structure, and thereby has a better metal barrier ability than the Ta film to prevent Cu extrusion of the top metal layer 106T.

In addition, the Ta film has a lower compressive stress than the second barrier film 124 such as TaN film deposited using a low level of power. While compared with the second barrier film 124 of the embodiments, the lower compressive stress of the Ta film has a poor effect to balance the tensile stress of the aluminum-containing layer 126. After a subsequent thermal process is performed on the aluminum-containing layer 126, for example a process temperature of about 400° C., a conductive pad structure with the Ta film disposed under the aluminum-containing layer is easy to cause Al extrusion defect. In order to avoid the Al extrusion, the equipment for the Ta film deposition needs to be configured with an additional chiller to reduce the temperature of the process chamber, and the fabrication cost is thereby increased. Moreover, an extra cooling time is added in queue time (Q-time) of wafer to wafer, and the fabrication yield is thereby decreased. According to the embodiments of the disclosure, the above-mentioned problems can be overcome.

Figure 4:
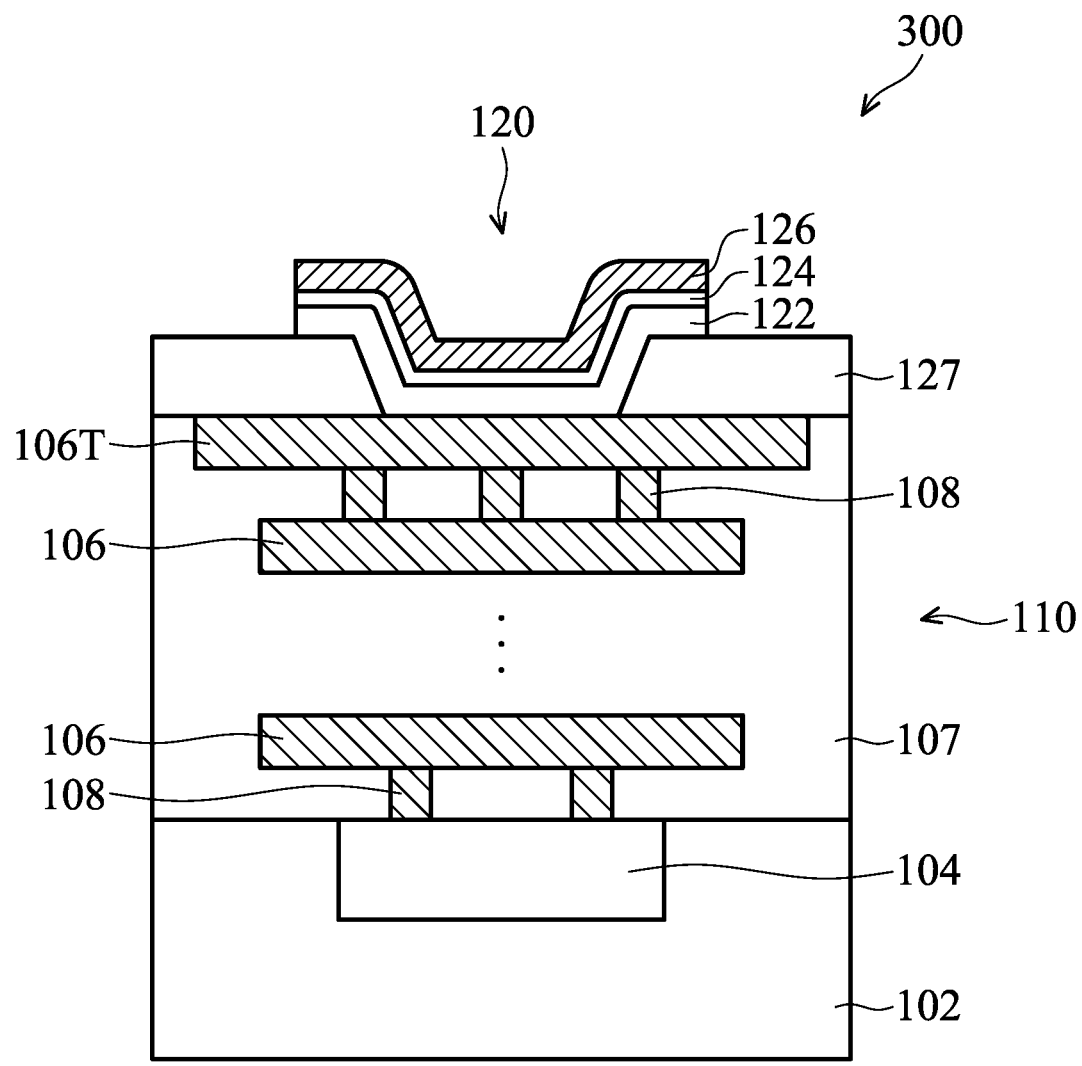
FIG. 4 shows a cross-sectional view of a semiconductor device having a conductive pad structure, in accordance with some embodiments.

FIG. 4 shows a cross-sectional view of a semiconductor device 300 having a conductive pad structure 120, in accordance with some embodiments. The difference between the semiconductor device 300 of FIG. 4 and the semiconductor device 100 of FIG. 1 is that a passivation layer 127 is formed on the top metal layer 106T of the interconnect structure 110. The passivation layer 127 has an opening to expose a portion of the top metal layer 106T. The conductive pad structure 120 is formed in the opening of the passivation layer 127 and onto a partial top surface of the passivation layer 127, as shown in FIG. 4 in accordance with some embodiments.

Moreover, the aluminum-containing layer 126, the first barrier film 122 and the second barrier film 124 of the conductive pad structure 120 are conformally deposited in the opening of the passivation layer 127 and onto the partial top surface of the passivation layer 127 to produce a recess of the conductive pad structure 120. The recess of the conductive pad structure 120 may help a conductive connection feature (not shown) such as a bonding wire or a solder ball to be bonded with the conductive pad structure 120. The conductive connection feature is provided for electrically coupling the conductive pad structure 120 to an external circuit.

The semiconductor device 300 includes a substrate 102, as shown in FIG. 4 in accordance with some embodiments. The substrate 102 may be a bulk semiconductor substrate, a semiconductor-on-insulator (SOI) substrate, or other semiconductor substrate, which may be doped (e.g., with a p-type or an n-type dopant) or undoped. The substrate 102 may be made of silicon or other semiconductor material. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

Multiple electronic elements 104 are formed in or on the substrate 102. The electronic elements 104 include static random access memory (SRAM) cells, active electronic elements, passive electronic elements and/or other logic circuits. The active electronic elements are for example P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or a combination thereof. The passive electronic elements are for example resistors, capacitors, and inductors.

The interconnect structure 110 is formed over the substrate 102 for electrically coupling various electronic elements 104 to fabricate integrated circuit. The interconnect structure 110 includes multiple metal layers 106, a top metal layer 106T, and multiple vias 108 in inter-metal dielectric (IMD) layers 107. The vias 108 provide vertical connection for electrically coupling the adjacent metal layers 106 and the top metal layer 106T. The materials and processes for forming the metal layers 106, the top metal layer 106T, the vias 108, and the IMD layers 107 may be the same as or similar to those described with respect to FIG. 1, and not repeated again.

The passivation layer 127 is formed over the interconnect structure 110, as shown in FIG. 4 in accordance with some embodiments. The passivation layer 127 has an opening to expose a portion of the top metal layer 106T for subsequently forming the conductive pad structure 120 in contact with the exposed portion of the top metal layer 106T. The passivation layer 127 further covers other portion of the top metal layer 106T for protecting the interconnect structure 110. Thereafter, the first barrier film 122, the second barrier film 124 and the aluminum-containing layer 126 are sequentially deposited in the opening of the passivation layer 127 and on the surface of the passivation layer 127 to form the conductive pad structure 120, as shown in FIG. 4 in accordance with some embodiments.

In some examples, the passivation layer 127 is made of an organic insulating material such as polyimide, epoxy resin or another suitable insulating material. In some other examples, the passivation layer 127 is made of an inorganic insulating material such as silicon oxide, silicon nitride, silicon oxynitride or other low dielectric constant (low-k) dielectric material. The passivation layer 127 can be patterned using photolithography and etching processes to form the opening.

In some embodiments, the first barrier film 122, the second barrier film 124 and the aluminum-containing layer 126 may be deposited using the processes and the materials which are the same as or similar to those used for the corresponding components of the conductive pad structure 120 in FIG. 1. Also, the first barrier film 122, the second barrier film 124 and the aluminum-containing layer 126 may be deposited using the processes and the materials with respect to the descriptions of the method 200 in FIG. 2 and the cross-sectional views of respective intermediate structures for forming the conductive pad structure 120 in FIGS. 3A-3E.

Figure 5A:
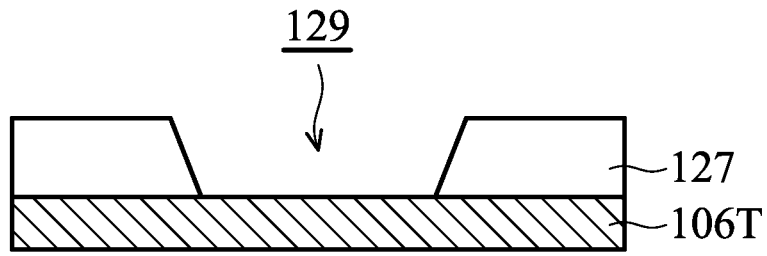
FIGS. 5A-5G show cross-sectional views of respective intermediate structures for forming a conductive pad structure and forming a conductive bump on the conductive pad structure, in accordance with some embodiments.

FIGS. 5A-5G show cross-sectional views of respective intermediate structures for forming the conductive pad structure 120 of FIG. 4 and forming a conductive bump 134 on the conductive pad structure 120, in accordance with some embodiments. A passivation material layer (not shown) is formed on the top metal layer 106T. In some examples, the passivation material layer may be polyimide, epoxy resin or other organic insulating material, which are photosensitive materials. The passivation material layer may be formed on the top metal layer 106T using a coating process. The passivation material layer is exposed to light through a photomask. Then, the passivation material layer is patterned using a development process to remove the exposed or unexposed portion of the passivation material layer to form the passivation layer 127 with an opening 129 therein, as shown in FIG. 5A in accordance with some embodiments. The exposed or unexposed portion of the passivation material layer is removed by the development process depending on that the passivation material layer is positive or negative type photoresist.

In some other examples, the passivation material layer may be silicon oxide, silicon nitride, silicon oxynitride or other low-k dielectric material. A patterned photoresist (not shown) is formed on the passivation material layer through a photolithography process such as the above-mentioned description. Thereafter, the passivation material layer is etched through using the patterned photoresist as an etching mask to form the passivation layer 127 with an opening 129 therein, as shown in FIG. 5A in accordance with some embodiments. The etching process for the passivation material layer may be a dry etching process such as a reactive ion etching (RIE) or another suitable etching process which is selected for the passivation material layer.

Figure 5B:
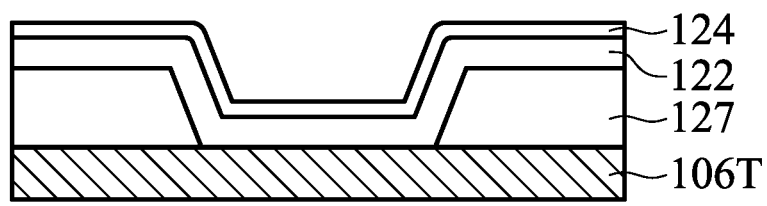

Thereafter, the first barrier film 122 and the second barrier film 124 are sequentially deposited in the opening 129 and on the surface of the passivation layer 127, as shown in FIG. 5B in accordance with some embodiments. In some embodiments, the first barrier film 122 is a metal nitride film such as TaN film, TiN film or another suitable metal nitride film with metal barrier ability. The first barrier film 122 is formed using a first deposition process with a first level of power. The first deposition process includes a physical vapor deposition (PVD) process, sputtering, evaporation, atomic layer deposition (ALD) process or another suitable deposition process. In some embodiments, the first level of power used in a PVD process is in a range from about 2000 W to about 10000 W, for example about 6000 W. In some examples, the first barrier film 122 has a thickness in a range from about 400 Å to about 800 Å, for example from about 484 Å to about 684 Å.

In some embodiments, the second barrier film 124 is a metal nitride film such as TaN film, TiN film or another suitable metal nitride film with metal barrier ability. The second barrier film 124 may be made of the same material as that of the first barrier film 122. The second barrier film 124 is conformally formed on the first barrier film 122 using a second deposition process with a second level of power that is lower than the first level of power. The second deposition process includes a PVD process, sputtering, evaporation, ALD process or another suitable deposition process. In some embodiments, the second level of power used in a PVD process is in a range from about 100 W to about 2000 W, for example about 500 W. In some embodiments, the second barrier film 124 has a thickness that is lesser than the thickness of the first barrier film 122. In some examples, the second barrier film 124 has a thickness in a range from about 5 Å to about 200 Å, for example from about 10 Å to about 180 Å.

According to the embodiments of the disclosure, the second barrier film 124, which is formed using a low level of power deposition process, has a higher nitrogen (N) atomic percentage than that of the first barrier film 122. In some embodiments, both the second barrier film 124 and the first barrier film 122 are TaN films. The second barrier film 124 has an atomic ratio of N to TaN in a range from about 0.86 to about 0.93. The first barrier film 122 has an atomic ratio of N to TaN in a range from about 0.19 to about 0.31. In some embodiments, the N to TaN atomic ratio of the second barrier film 124 to the N to TaN atomic ratio of the first barrier film 122 is in a range from about 2.5 to about 5.0, for example about 2.77 to about 4.90.

Figure 5C:
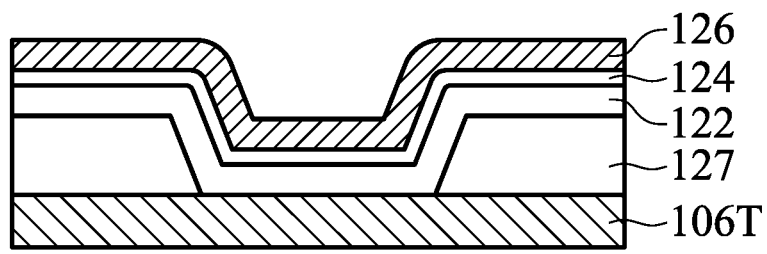

Thereafter, the aluminum-containing layer 126 is conformally formed on the second barrier film 124, as shown in FIG. 5C in accordance with some embodiments. In some embodiments, the aluminum-containing layer 126 may be an AlCu layer, an Al layer or other conductive material containing aluminum and providing a satisfactory conductivity. The aluminum-containing layer 126 may be formed using a PVD process, sputtering, evaporation, ALD process or another suitable deposition process. In some embodiments, the aluminum-containing layer 126 has a thickness that is greater than the thickness of the first barrier film 122. In some examples, the aluminum-containing layer 126 has a thickness in a range from about 500 Å to about 1000 Å.

Figure 5D:
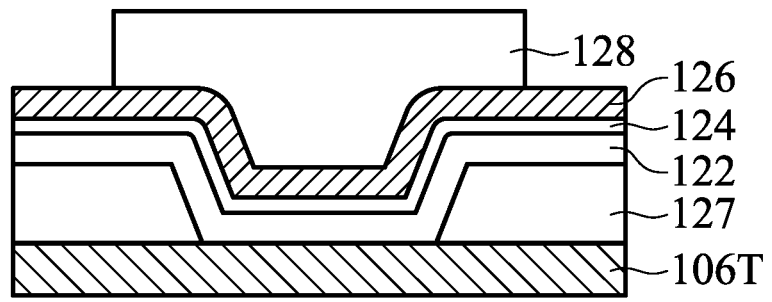

Next, an etching mask 128 is formed on the aluminum-containing layer 126, as shown in FIG. 5D in accordance with some embodiments. The etching mask 128 may be a patterned photoresist, a hard mask or another suitable mask for use in etching processes of the aluminum-containing layer 126, the second barrier film 124 and the first barrier film 122. The materials and the processes of forming the etching mask 128 may be the same as or similar to those as described with respect to FIG. 3D, and not repeated again.

Figure 5E:
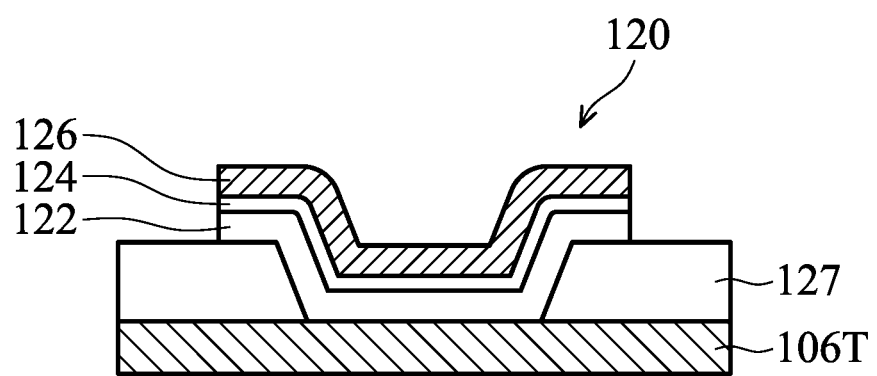

Thereafter, the aluminum-containing layer 126, the second barrier film 124 and the first barrier film 122 are patterned using an etching process to form the conductive pad structure 120, as shown in FIG. 5E in accordance with some embodiments. The etching process may be dry etching process such a RIE process or another suitable etching process. The conductive pad structure 120 is formed in the opening 129 (as shown in FIG. 5A) and on the surface of the passivation layer 127. The conductive pad structure 120 may have a recess on the surface.

According to the embodiments of the disclosure, the second barrier film 124 is made of metal nitride, for example TaN, and is formed using a deposition process with a lower level of power than that for the first barrier film 122. Therefore, the second barrier film 124 has a higher N atomic percentage than that of the first barrier film 122 and is formed with an amorphous structure. As a result, the second barrier film 124 can provide a better metal barrier ability to prevent the metal such as Cu of the underlying top metal layer 106T from extrusion.

Moreover, the second barrier film 124 also has a higher compressive stress than that of the first barrier film 122. Therefore, the higher compressive stress of the second barrier film 124 can balance with the tensile stress of the aluminum-containing layer 126 to prevent the metal Al of the aluminum-containing layer 126 from extrusion. As a result, the conductive pad structure 120 of the embodiments can effectively avoid metal extrusion such as Cu extrusion of the top metal layer 106T and the metal extrusion such as Al extrusion of the aluminum-containing layer 126. The conductive pad structure 120 with a better quality is thereby achieved.

Figure 5F:
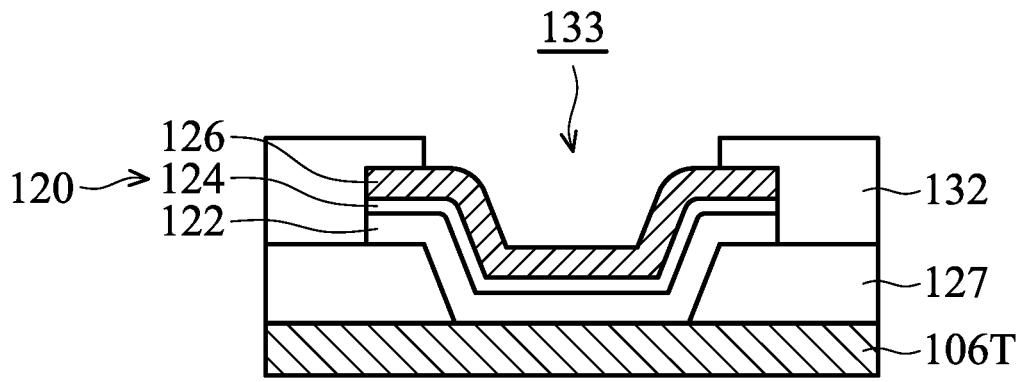

Next, another passivation layer 132 is formed on the conductive pad structure 120, as shown in FIG. 5F in accordance with some embodiments. The passivation layer 132 has an opening 133 to expose a portion of the conductive pad structure 120, for example a partial top surface of the aluminum-containing layer 126, for electrically coupling to an external circuit (not shown). The material and the process for forming the passivation layer 132 may be the same as or similar to those of forming the passivation layer 127, and not repeated again.

Figure 5G:
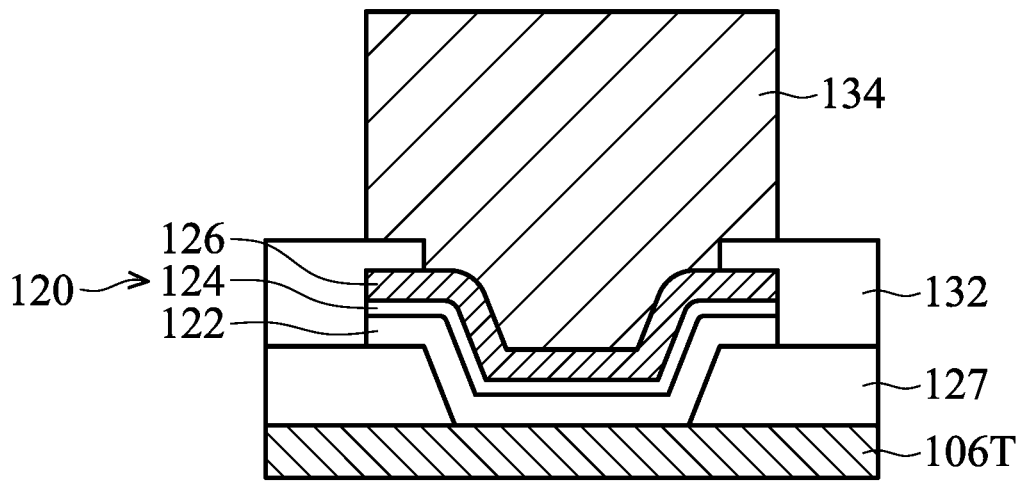

Thereafter, a conductive connection feature 134 is formed in the opening 133 of the passivation layer 132 and is in contact with the conductive pad structure 120, as shown in FIG. 5G in accordance with some embodiments. The conductive connection feature 134 may be a conductive bump or pillar as shown in FIG. 5G, or a solder ball or a bonding wire (not shown). The conductive pad structure 120 is electrically coupled to an external circuit through the conductive connection feature 134 for transferring electrical signals between the external circuit and the semiconductor device with the conductive pad structure 120. The conductive connection feature 134 may made of aluminum, copper, gold, silver, alloy thereof, a combination thereof, or another suitable conductive material. The conductive connection feature 134 may be formed using evaporation, sputtering, electroplating or printing process.

Figure 6:
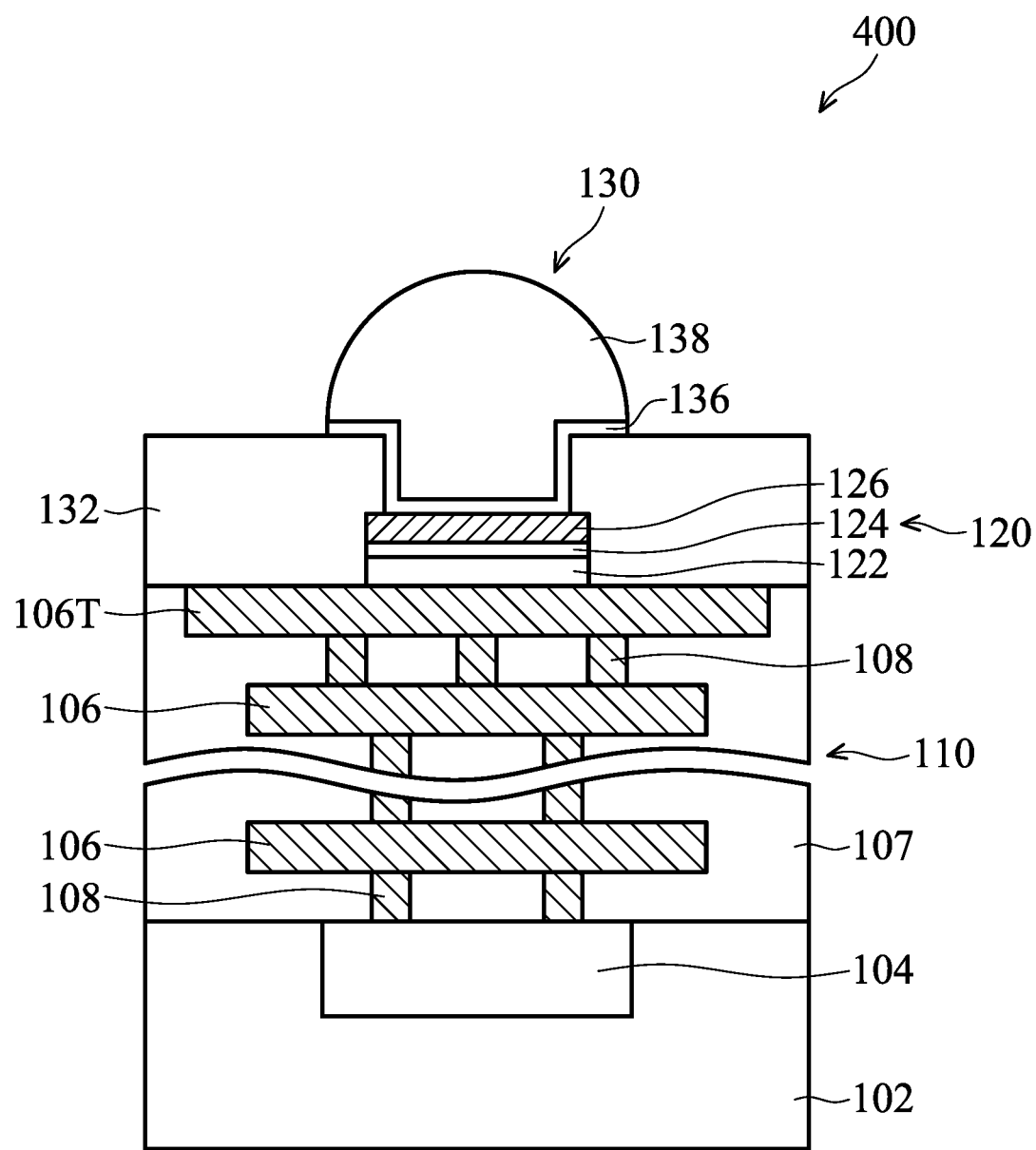
FIG. 6 shows a cross-sectional view of a semiconductor device having a conductive pad structure and a conductive connection feature on the conductive pad structure, in accordance with some embodiments.

FIG. 6 shows a cross-sectional view of a semiconductor device 400 having a conductive pad structure 120, in accordance with some embodiments. The difference between the semiconductor device 400 of FIG. 6 and the semiconductor device 100 of FIG. 1 is that a passivation layer 132 is formed on an interconnect structure 110 and on the conductive pad structure 120. The passivation layer 132 has an opening to expose a partial top surface of the conductive pad structure 120 for electrically coupling to an external circuit (not shown). The passivation layer 132 covers the sidewalls of the conductive pad structure 120 for protecting the conductive pad structure 120 in subsequent fabrication.

The semiconductor device 400 includes a substrate 102 having multiple electronic elements 104 formed therein or thereon, although one component 104 is shown in FIG. 6, any number of the electronic elements 104 can be formed in or on the substrate 102. The substrate 102 and the electronic element 104 may be the same as or similar to those described with respect to FIG. 1 and not repeated again. The semiconductor device 400 also includes the interconnect structure 110 formed on the substrate 102 for electrically coupling various electronic elements 104 to fabricate integrated circuit. The interconnect structure 110 includes multiple metal layers 106, a top metal layer 106T, and multiple vias 108 in inter-metal dielectric (IMD) layers 107. The vias 108 provide vertical connection for electrically coupling the adjacent metal layers 106, and the top metal layer 106T. The materials and processes for forming the metal layers 106, the top metal layer 106T, the vias 108, and the IMD layers 107 may be the same as or similar to those described with respect to FIG. 1, and not repeated again.

In some embodiments, the conductive pad structure 120 including the first barrier film 122, the second barrier film 124 and the aluminum-containing layer 126 is formed on the top metal layer 106T of the interconnect structure 110. The materials and the processes for forming the first barrier film 122, the second barrier film 124 and the aluminum-containing layer 126 may be the same as or similar to those described with respect to FIG. 1, and not repeated again. According to the embodiments of the disclosure, the conductive pad structure 120 can effectively avoid metal extrusion such as Cu extrusion of the top metal layer 106T and the metal extrusion such as Al extrusion of the aluminum-containing layer 126. The conductive pad structure 120 with a satisfactory quality is thereby obtained.

Thereafter, the passivation layer 132 is formed on the interconnect structure 110 and covering the sidewalls and a partial top surface of the conductive pad structure 120. The passivation layer 132 is patterned to have an opening to expose a portion of the conductive pad structure 120. In some examples, the material of the passivation layer 132 may be polyimide, epoxy resin or other organic insulating material, which are photosensitive materials. The passivation material layer may be formed on the interconnect structure 110 and on the conductive pad structure 120 using a coating process, and then the passivation material layer is exposed to light through a photomask. The passivation material layer is patterned to form the passivation layer 132 using a development process to remove the exposed or unexposed portion of the photosensitive material. The passivation layer 132 has an opening to expose the conductive pad structure 120. The exposed or unexposed portion of the photosensitive material is removed by the development process depending on that the photosensitive material is positive or negative type photoresist.

In some other examples, the material of the passivation layer 132 may be silicon oxide, silicon nitride, silicon oxynitride or other low-k dielectric material. The passivation layer 132 is patterned using photolithography and etching processes such as the above-mentioned description of the passivation layer 132 with respect to FIG. 5F.

Thereafter, a conductive connection feature 130 is formed in the opening of the passivation layer 132 and is in contact with the conductive pad structure 120, as shown in FIG. 6 in accordance with some embodiments. The conductive connection feature 130 may be a solder ball 138 with a under bump metallurgy (UBM) layer 136 thereunder as shown in FIG. 6 in accordance with some embodiments. In other examples, the conductive connection feature 130 may be a metal pillar, a metal bump or a bonding wire. The conductive pad structure 120 is electrically coupled to an external circuit through the conductive connection feature 130. The solder ball 138 may made of PbSn alloy or any suitable solder material, and the UBM layer 136 may made of multiple layers which may be selected from a group consisting of Ti, Cr, TiW, Ni, Cu and Au. The conductive connection feature 130 may be formed using evaporation, sputtering, electroplating or printing process.

Figure 7:
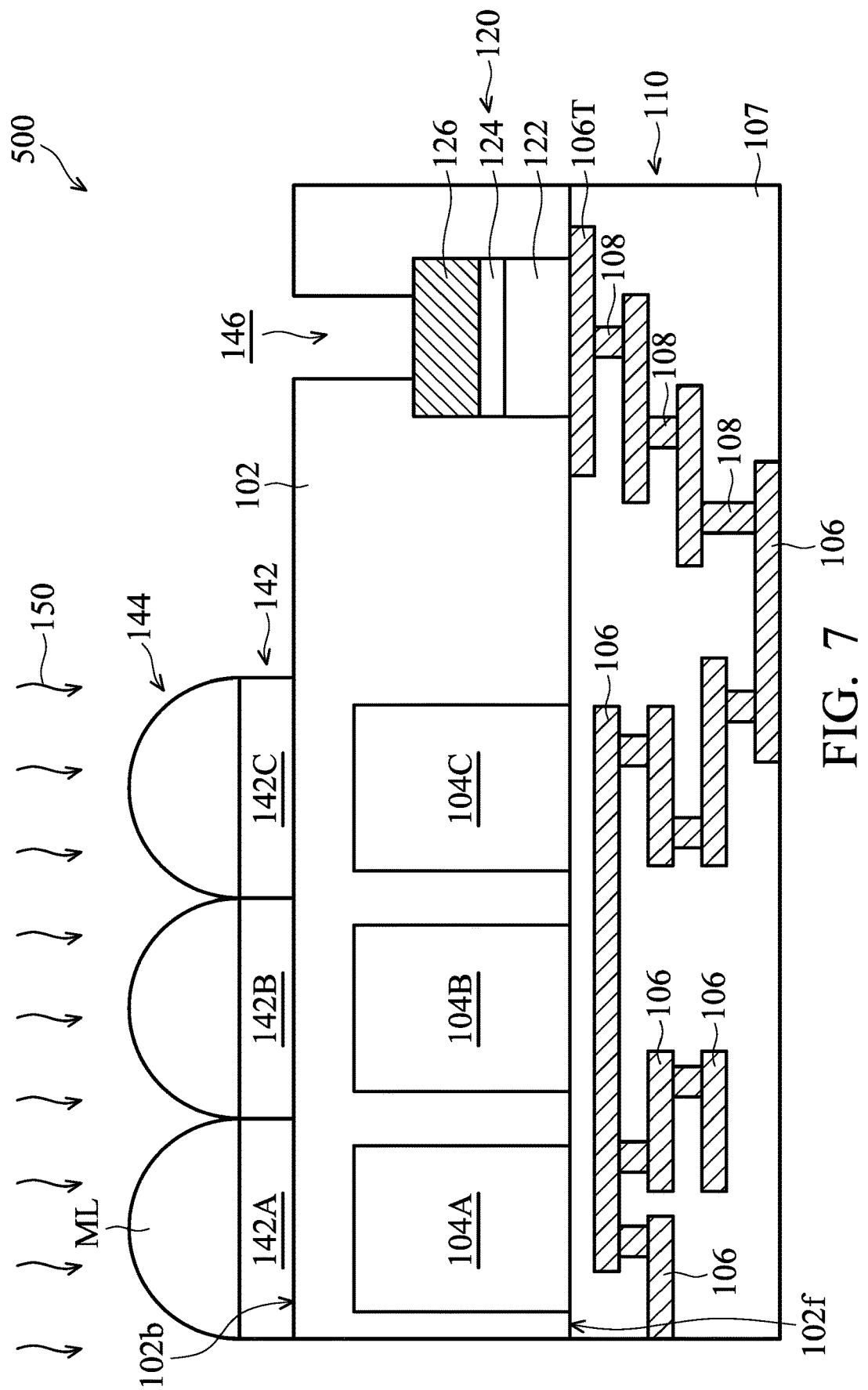
FIG. 7 shows a cross-sectional view of a semiconductor image sensor device having a conductive pad structure, in accordance with some embodiments.

FIG. 7 shows a cross-sectional view of a semiconductor image sensor device, for example a back side illumination (BSI) image sensor device 500 having a conductive pad structure 120, in accordance with some embodiments. The BSI image sensor device 500 includes a substrate 102 and multiple photo-sensing elements 104A, 104B and 104C formed in the substrate 102. The photo-sensing elements 104A, 104B and 104 may be photodiodes, and each of the photo-sensing elements 104A, 104B and 104 individually corresponds to one pixel of the BSI image sensor device 500. Although there are three photo-sensing elements 104A, 104B and 104C shown in FIG. 7, any number of the photo-sensing elements can be formed in the substrate 102 and are arranged into a pixel array of the BSI image sensor device 500.

The substrate 102 may be a silicon wafer or other semiconductor substrate. The substrate 102 has a front side surface 102f and a back side surface 102b that is opposite to the front side surface 102f. In some embodiments, the conductive pad structure 120 is formed in the substrate 102 near the front side surface 102f. According to the embodiments of the disclosure, the conductive pad structure 120 includes the first barrier film 122, the second barrier film 124 and the aluminum-containing layer 126, which can be formed using the materials and the processes the same as or similar to those described with respect to the conductive pad structure 120 of FIG. 1.

The BSI image sensor device 500 also includes the interconnect structure 110 formed under the front side surface 102f of the substrate 102, as shown in FIG. 7 in accordance with some embodiments. The interconnect structure 110 is used for electrically coupling multiple transistors (not shown) in the substrate 102. The transistors are configured to correspond with each of the photo-sensing elements. The interconnect structure 110 includes multiple metal layers 106, a top metal layer 106T, and multiple vias 108 in inter-metal dielectric (IMD) layers 107. The materials and processes for forming the metal layers 106, the top metal layer 106T, the vias 108, and the IMD layers 107 may be the same as or similar to those described with respect to FIG. 1, and not repeated again.

In addition, the first barrier film 122 of the conductive pad structure 120 is in contact with the top metal layer 106T of the interconnect structure 110. The aluminum-containing layer 126 of the conductive pad structure 120 is exposed through an opening 146 that is formed from the back side surface 102b of the substrate 102 until to the surface of the aluminum-containing layer 126. According to the embodiments of the disclosure, the conductive pad structure 120 can effectively avoid metal extrusion such as Cu extrusion of the top metal layer 106T and the metal extrusion such as Al extrusion of the aluminum-containing layer 126. The conductive pad structure 120 with a satisfactory quality is thereby obtained.

Furthermore, a color filter layer 142 is formed on the back side surface 102b of the substrate 102, as shown in FIG. 7 in accordance with some embodiments. The color filter layer 142 includes multiple color filters, such as a red color filter 142A, a green color filter 142B, and a blue color filter 142C, which are disposed corresponding with each of the photo-sensing elements, for example the photo-sensing elements 104A, 104B and 104C, respectively.

In addition, a micro-lens layer 144 is disposed on the color filter layer 142, as shown in FIG. 7 in accordance with some embodiments. The micro-lens layer 144 includes multiple micro-lenses ML corresponding with each of the color filters, for example the red color filter 142A, the green color filter 142B, and the blue color filter 142C, respectively. In the BSI image sensor device 500, a light 150 illuminates on the back side surface 102b of the substrate 102. The micro-lenses ML can focus the light 150 on the corresponding photo-sensing elements such as the photo-sensing elements 104A, 104B, and 104C in each pixel. Moreover, each of the various color filters 142A, 142B and 142C can filter a certain color of light to the corresponding photo-sensing elements 104A, 104B, and 104C, respectively.

Embodiments for fabricating semiconductor devices having a conductive pad structure with multi-barrier films are provided. The semiconductor devices may be various type semiconductor devices which include the conductive pad structures 120. The conductive pad structure 120 includes a first barrier film 122, a second barrier film 124 on the first barrier film 122, and an aluminum-containing layer 126 on the second barrier film 124. The conductive pad structure 120 is disposed on a top metal layer 106T of an interconnect structure 110. The top metal layer 106T may be made of Cu. The first barrier film 122 and the second barrier film 124 may be made of metal nitride, for example TaN. The first barrier film 122 is formed using a first deposition process with a first level of power. The second barrier film 124 is formed using a second deposition process with a second level of power that is lower than the first level of power. As a result, the second barrier film 124 has a higher N atomic percentage than that of the first barrier film 122, and thus the second barrier film 124 has an amorphous structure. Therefore, the second barrier film 124 can provide a better metal barrier ability to prevent the metal such as Cu of the underlying top metal layer 106T from extrusion.

In addition, the second barrier film 124 with the higher N atomic percentage than that of the first barrier film 122 also has a higher compressive stress than that of the first barrier film 122. Therefore, the higher compressive stress of the second barrier film 124 can balance with the tensile stress of the aluminum-containing layer 126 to prevent the metal Al of the aluminum-containing layer 126 from extrusion.

Accordingly, the conductive pad structures 120 of the embodiments of the disclosure can effectively avoid the metal extrusion such as Cu extrusion of the top metal layer 106T and the metal extrusion such as Al extrusion of the aluminum-containing layer 126. The conductive pad structures 120 with satisfactory quality are thereby obtained. The yield and the reliability of the semiconductor devices with the conductive pad structures 120 are thereby enhanced.

In some embodiments, a method of fabricating a semiconductor device is provided. The method includes forming an interconnect structure over a substrate. The method also includes forming a passivation layer over the interconnect structure. The method further includes forming an opening in the passivation layer to expose a portion of the interconnect structure. In addition, the method includes sequentially forming a lower barrier film, an upper barrier film, and an aluminum-containing layer in the opening. The lower barrier film and the upper barrier film are made of metal nitride, and the upper barrier film has a nitrogen atomic percentage that is higher than a nitrogen atomic percentage of the lower barrier film and has an amorphous structure.

In some embodiments, a method of fabricating a semiconductor device is provided. The method includes forming an interconnect structure over a substrate. The interconnect structure includes a copper layer. The method also includes depositing a crystalline tantalum-nitride (TaN) film in contact with the copper layer. The method further includes depositing an amorphous tantalum-nitride (TaN) film over the crystalline TaN film. The method also includes depositing an aluminum-containing layer over the amorphous TaN film. In addition, the method includes patterning the aluminum-containing layer, the amorphous TaN film and the crystalline TaN film to form a conductive pad structure.

In some embodiments, a method of fabricating a semiconductor device is provided. The method includes forming an interconnect structure over a substrate. The interconnect structure is electrically coupled to electronic elements in the substrate. The method also includes forming a conductive pad structure in contact with the interconnect structure. Forming the conductive pad structure includes forming a lower tantalum-nitride (TaN) film using a first deposition process with a first level of power. Forming the conductive pad structure also includes forming an upper tantalum-nitride (TaN) film over the lower TaN film using a second deposition process with a second level of power that is different from the first level of power. The upper TaN film has a nitrogen atomic percentage that is higher than a nitrogen atomic percentage of the lower TaN film. Forming the conductive pad structure further includes forming an aluminum-containing layer over the upper TaN film. In addition, forming the conductive pad structure includes patterning the aluminum-containing layer, the upper TaN film, and the lower TaN layer.

In some embodiments, a method of fabricating a semiconductor device is provided. The method includes providing a substrate and forming an interconnect structure on the substrate. The interconnect structure includes a top metal layer. The method also includes forming a first barrier film on the top metal layer using a first deposition process with a first level of power, and forming a second barrier film on the first barrier film using a second deposition process with a second level of power that is lower than the first level of power. The method further includes forming an aluminum-containing layer on the second barrier film. In addition, the method includes patterning the first barrier film, the second barrier film and the aluminum-containing layer to form a conductive pad structure.

In some embodiments, a method of fabricating a semiconductor device is provided. The method includes providing a substrate having an interconnect structure formed thereon. The interconnect structure includes a top metal layer. The method also includes forming a passivation layer on the interconnect structure, and forming an opening in the passivation layer to expose the top metal layer. The method further includes depositing a first tantalum-nitride (TaN) film in the opening using a first deposition process with a first level of power, and depositing a second tantalum-nitride (TaN) film on the first TaN film using a second deposition process with a second level of power that is lower than the first level of power. In addition, the method includes depositing an aluminum-containing layer on the second TaN film, and patterning the aluminum-containing layer, the second TaN film and the first TaN film to form a conductive pad structure in the opening to be in contact with the top metal layer.

In some embodiments, a semiconductor device is provided. The semiconductor device includes a substrate having a plurality of electronic elements. The semiconductor device also includes an interconnect structure over the substrate. The interconnect structure includes a top metal layer. The semiconductor device further includes a conductive pad structure over the interconnect structure. In addition, the conductive pad structure includes a first barrier film on the top metal layer. The conductive pad structure also includes a second barrier film on the first barrier film. The conductive pad structure further includes an aluminum-containing layer on the second barrier film. In addition, both the first barrier film and the second barrier film include tantalum-nitride (TaN), and the second barrier film has a nitrogen (N) atomic percentage that is higher than a nitrogen (N) atomic percentage of the first barrier film.

In some embodiments, a semiconductor device is provided. The semiconductor device includes a substrate, an interconnect structure, and a conductive pad structure. The interconnect structure is over the substrate and includes a top metal layer. The conductive pad structure is over the interconnect structure and includes a lower barrier film, an upper barrier film, and an aluminum-containing layer. The lower barrier film is on the top metal layer. The upper barrier film is on the lower barrier film and has an amorphous structure. The aluminum-containing layer is on the upper barrier film. The lower barrier film and the upper barrier film are made of a same material, and a nitrogen (N) atomic percentage of the upper barrier film is higher than a nitrogen (N) atomic percentage of the lower barrier film.

In some embodiments, a semiconductor device is provided. The semiconductor device includes a substrate, an interconnect structure, and a conductive pad structure. The substrate includes electronic elements. The interconnect structure is over the substrate and is electrically coupled to the electronic elements. The conductive pad structure is over the interconnect structure and includes a crystalline tantalum-nitride (TaN) film, an amorphous tantalum-nitride (TaN) film on the crystalline TaN film, and an aluminum-containing layer on the amorphous TaN film.

In some embodiments, a semiconductor device is provided. The semiconductor device includes a substrate, an interconnect structure, and a conductive pad structure. The substrate has a front side surface and a back side surface opposite to the front side surface. The interconnect structure is under the front side surface of the substrate. The conductive pad structure is in the substrate and includes a first tantalum-nitride (TaN) film, a second tantalum-nitride (TaN) film on the first TaN film, and an aluminum-containing layer on the second TaN film. The second TaN film has a higher compressive stress than that of the first TaN film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an interconnect structure over the substrate and comprising a top metal layer; and
   a conductive pad structure over the interconnect structure and comprising:
   a lower barrier film on the top metal layer;
   an upper barrier film on the lower barrier film and having an amorphous structure; and
   an aluminum-containing layer on the upper barrier film, wherein the lower barrier film and the upper barrier film are made of a same material, and a nitrogen (N) atomic percentage of the upper barrier film is higher than a nitrogen (N) atomic percentage of the lower barrier film.

2. The semiconductor device as claimed in claim 1, wherein the N atomic percentage of the upper barrier film is in a range from about 2.5 times to about 5 times greater than the N atomic percentage of the lower barrier film.

3. The semiconductor device as claimed in claim 1, wherein the lower barrier film and the upper barrier film are made of tantalum nitride (TaN).

4. The semiconductor device as claimed in claim 1, wherein the top metal layer is made of copper (Cu), and the aluminum-containing layer is made of aluminum-copper (AlCu) alloy.

5. The semiconductor device as claimed in claim 1, wherein a thickness of the lower barrier film is greater than a thickness of the upper barrier film.

6. The semiconductor device as claimed in claim 5, wherein the thickness of the lower barrier film is in a range from about 2.5 times to about 70 times greater than the thickness of the upper barrier film.

7. The semiconductor device as claimed in claim 1, further comprising a passivation layer between the lower barrier film and the top metal layer and surrounding bottom portions of the lower barrier film, the upper barrier film, and the aluminum-containing layer.

8. The semiconductor device as claimed in claim 7, further comprising a conductive bump over the aluminum-containing layer and partially surrounded by the aluminum-containing layer.

9. A semiconductor device, comprising:
   a substrate comprising electronic elements;
   an interconnect structure over the substrate and electrically coupled to the electronic elements; and
   a conductive pad structure over the interconnect structure and comprising:
   a crystalline tantalum-nitride (TaN) film;
   an amorphous tantalum-nitride (TaN) film on the crystalline TaN film; and
   an aluminum-containing layer on the amorphous TaN film.

10. The semiconductor device as claimed in claim 9, wherein a nitrogen (N) atomic percentage of the amorphous TaN film is higher than a nitrogen (N) atomic percentage of the crystalline TaN film.

11. The semiconductor device as claimed in claim 9, wherein the crystalline TaN film has an atomic ratio of N to TaN in a range from about 0.19 to about 0.31, and the amorphous TaN film has an atomic ratio of N to TaN in a range from about 0.86 to about 0.93.

12. The semiconductor device as claimed in claim 9, wherein the amorphous TaN film has a higher compressive stress than that of the crystalline TaN film.

13. The semiconductor device as claimed in claim 9, wherein the aluminum-containing layer is made of aluminum-copper (AlCu) alloy and has a tensile stress.

14. The semiconductor device as claimed in claim 9, wherein a thickness of the crystalline TaN film is greater than a thickness of the amorphous TaN film.

15. The semiconductor device as claimed in claim 14, wherein a thickness of the aluminum-containing layer is greater than the thickness of the amorphous TaN film.

16. A semiconductor device, comprising:
    a substrate having a front side surface and a back side surface opposite to the front side surface;
    an interconnect structure under the front side surface of the substrate; and
    a conductive pad structure in the substrate and comprising:
    a first tantalum-nitride (TaN) film;
    a second tantalum-nitride (TaN) film on the first TaN film, wherein the second TaN film has a higher compressive stress than that of the first TaN film; and
    an aluminum-containing layer on the second TaN film.

17. The semiconductor device as claimed in claim 16, wherein the first TaN film is on the front side surface of the substrate and in contact with a top layer of the interconnect structure.

18. The semiconductor device as claimed in claim 17, wherein the top layer of the interconnect structure is made of copper (Cu), and the aluminum-containing layer is made of aluminum-copper (AlCu) alloy.

19. The semiconductor device as claimed in claim 16, further comprising an opening extending from the back side surface of the substrate and exposing the aluminum-containing layer.

20. The semiconductor device as claimed in claim 16, further comprising:
    multiple photo-sensing elements in the substrate; and
    multiple color filters on the back side surface of the substrate and disposed corresponding with each of the photo-sensing elements.

* * * * *